United States Patent
Greve

[11] Patent Number: 6,166,808
[45] Date of Patent: *Dec. 26, 2000

[54] OPTICAL HEIGHT METER, SURFACE-INSPECTION DEVICE PROVIDED WITH SUCH A HEIGHT METER, AND LITHOGRAPHIC APPARATUS PROVIDED WITH THE INSPECTION DEVICE

[75] Inventor: Peter F. Greve, Eindhoven, Netherlands

[73] Assignee: U.S. Philips Corporation, New York, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/984,748

[22] Filed: Dec. 4, 1997

[30] Foreign Application Priority Data

Dec. 24, 1996 [EP] European Pat. Off. .............. 96203736

[51] Int. Cl.⁷ ............................ G01B 11/14; G01N 21/00
[52] U.S. Cl. .................. 356/375; 356/237.4; 356/239.1; 250/548
[58] Field of Search ..................................... 356/375, 376, 356/371, 237, 237.1, 237.2, 237.3, 237.4, 237.5, 239.1, 338; 250/548

[56] References Cited

U.S. PATENT DOCUMENTS

| | | | |
|---|---|---|---|
| 3,857,637 | 12/1974 | Obenreder | 356/371 |
| 4,477,185 | 10/1984 | Berger et al. | 356/400 |
| 4,558,949 | 12/1985 | Uehara et al. | 356/375 |
| 5,298,974 | 3/1994 | Chandley | 356/371 |
| 5,381,225 | 1/1995 | Kohno | 356/431 |
| 5,510,892 | 4/1996 | Mizutani et al. | 356/375 |
| 5,737,074 | 4/1998 | Haga et al. | 356/371 |

*Primary Examiner*—Hoa Q. Pham

[57] ABSTRACT

A height meter for measuring the height of a first surface of a transparent object is described, which height meter comprises a radiation source for supplying a converging measuring beam whose chief ray extends at an angle to the normal on the surface, and a radiation-sensitive detection unit for detecting a radiation beam reflected by the surface to be measured. Since a diaphragm is arranged in the path of this beam, it is prevented that radiation reflected by a second surface situated opposite the first surface can reach the detection unit. The height meter is notably suitable for an inspection device for a lithographic mask.

8 Claims, 3 Drawing Sheets

OPTICAL HEIGHT METER, SURFACE-INSPECTION DEVICE PROVIDED WITH SUCH A HEIGHT METER, AND LITHOGRAPHIC APPARATUS PROVIDED WITH THE INSPECTION DEVICE

Optical height meter, surface-inspection device provided with such a height meter, and lithographic apparatus provided with the inspection device.

BACKGROUND OF THE INVENTION

The invention relates to an optical height meter for measuring the height of a first surface of a transparent object having a reflecting second surface facing the first surface, said height meter comprising a radiation source unit for supplying a converging measuring beam whose chief ray extends at a first angle to the normal on the first surface, and a position-sensitive detection unit for detecting a radiation beam reflected by the first surface, the chief ray of said radiation beam extending at a second angle to said normal, which angle is opposite to the first angle, and a diaphragm being arranged between the first surface and the detection unit in the radiation path of the reflected radiation beam.

The invention also relates to an optical surface-inspection device and to a lithographic apparatus in which the inspection device is used for inspecting a lithographic mask whose pattern is to be projected on a substrate.

An optical height meter operating in accordance with the triangulation principle is known from, inter alia, the English-language abstract of Japanese Patent Application 5-332769 laid open to public inspection. In these types of height meters, a radiation beam is directed at an angle to the normal onto the surface to be measured, and the beam reflected by this surface is received by a position-sensitive detector or a camera, for example a CCD camera. Such a detector or camera are understood to fall within the scope of the above-mentioned term of position-sensitive detection unit. When shifting the surface in a direction perpendicular to this surface, the radiation spot formed by the reflected beam on the detector is displaced across the detector, so that the height of the surface can be determined by measuring the position of this radiation spot. In the height meter described in Japanese Patent Application 5-332769, a diaphragm is arranged in the path of the reflected beam, and a lens is placed both in front of and behind this diaphragm. The object of this arrangement is to ensure that the radiation spot formed on the surface to be measured is imaged on the detector in a 1:1 ratio under all circumstances, inter alia, at a tilt of this surface.

U.S. Pat. No. 5,359,407 describes an optical surface-inspection device which is used in the optical lithography technique for manufacturing semiconductor circuits (ICs) or liquid crystalline display panels (LCDs). A photolithographic apparatus, a wafer stepper or a wafer step-and-scanner comprising a mask table, a projection lens system and a substrate table is used with this device. The wafer stepper images a mask, which has a first pattern and is provided in the mask table, in a reduced form on a first IC area of a substrate which has a photosensitive layer and is provided in the substrate table. Subsequently, the substrate is moved with respect to the projection lens system and the mask in such a way that a second IC area comes underneath the lens system, and the mask pattern is imaged on this second area. This is continued until the mask pattern has been imaged on all IC areas of the substrate. Then, the illuminated substrate is removed from the wafer stepper so as to be developed and etched and to undergo further treatments. This substrate is then provided with a new photosensitive layer and introduced into the same or a different wafer stepper so as to be illuminated with a second mask pattern.

The details of the patterns which can be formed with a wafer stepper in a substrate have line widths of 0.5 micrometer or less. Alien particles, such as dust particles, in the radiation path may thus have a disastrous effect on the images formed. It should therefore be ensured that the apparatus itself, but also the substrates introduced into the apparatus, should be free from dust to a high degree. It is even more important that the masks are free from dust. In fact, a dust particle on a mask pattern will disturb all images formed of this pattern in the different IC areas of the substrate, so that all ICs manufactured on this substrate will exhibit the same defect. Since the details in the mask pattern are only a small factor, for example a factor of four or five, larger than those in the substrate, dust particles on the mask pattern have a great influence on the mask pattern image formed. It is therefore desirable to inspect the masks on the presence of dust particles and other contaminations before they are placed in the mask table. A very accurate and reliable mask inspection device is necessary for this purpose. As described in U.S. Pat. No. 5,359,407, a small radiation spot may be moved across the entire mask pattern for inspecting a mask surface, and the presence of a dust particle can be detected with a radiation-sensitive detector arranged in such a way that it can receive dust particle-diffused radiation of this spot. To inspect the entire upper surface of the mask pattern, a scanning radiation beam is used which scans the pattern in a first direction, in combination with a movement of the mask in a second direction perpendicular to the first direction.

The mask comprises a transparent substrate having a well-polished upper side and a mask pattern, provided on the lower side, in the form of, for example, a chromium pattern. This pattern has been pre-inspected very accurately on the presence of dust particles having small to very small dimensions of the order of 0.1 micron, and is then covered with a transparent protective layer in the form of, for example a foil. Before the mask has been introduced into the apparatus, coarser dust particles may have deposited on this foil as well as on the upper side of the mask, so that both this upper side and the foil must be inspected. To this end, two scanning inspection beams are used, one of which is directed onto the upper side of the mask and the other is directed onto the foil.

In this surface inspection, the distance, in the direction of a normal on the surface, between the detector and the surface is a critical parameter. If this distance is unequal to the desired distance, a part of the radiation specularly reflected by a dust-free area of the surface may reach the detector so that this detector supplies an erroneous signal. A reliable and sufficiently accurate height meter is therefore needed with which the height of the upper side of the mask introduced into the inspection device, and hence the distance between this surface and the detector, can be measured. This height meter supplies an electric signal with which this distance can be corrected.

When a conventional height meter is used, the problem occurs that radiation of the scanning beam reaches the lower side of the mask, where the mask pattern to be imaged is present. This mask pattern is constituted by a pattern of line-shaped apertures in an opaque layer, for example a chromium layer which reflects very well and better than the, generally glass, upper side of the mask. As a result, quite a considerable quantity of radiation coming from the lower side of the mask reaches the detector of the height meter, so that this meter supplies an erroneous signal.

SUMMARY OF THE INVENTION

The present invention provides a height meter in which this problem does not occur. The height meter according to the invention is characterized in that the diaphragm is arranged at such a position and has such an aperture that only said, first, reflected radiation beam can pass through said aperture and reach the detection unit, and that a second radiation beam reflected by the second surface is blocked by the diaphragm.

The plane of the diaphragm is preferably situated perpendicularly to the chief ray of the first radiation beam.

This measure ensures that the height measurement is not affected by radiation which does not come from the first surface.

It is to be noted that the diaphragm in this height meter has a different function than the diaphragm in the device described in Japanese Patent Application 5-332769. In the known device, the assembly of a first condensor lens, the diaphragm and a second condenser lens ensures that, irrespective of the condition of the surface to be measured or of a tilt of this surface, a 1:1 image of the radiation spot on the surface to be measured is always formed on the detector.

It is further noted that the English-language abstract of Japanese Patent Application 4-31748 describes an apparatus for measuring a plate-shaped transparent object in which a radiation-blocking plate is arranged above the upper side of the plate. This apparatus is intended to detect defects in the upper side of the object. The blocking plate is arranged parallel to the surface to be measured and its function is to prevent measuring beam radiation reflected by the lower side of the object and diffused by a defect in the upper side of the object outside the measuring radiation spot from reaching the detector.

The English-language abstract of Japanese Patent Application 3-231103 also describes an optical measuring apparatus in which a diaphragm is arranged in the path of a radiation beam reflected by an object to be measured. However, this apparatus is intended for measuring the thickness of a thin film provided on the object.

A preferred embodiment of the height meter according to the invention is further characterized in that the measuring beam is focused in a plane behind the object, and in that the diaphragm is situated in a plane between the focal plane of the first reflected beam and the focal plane of the second reflected beam.

The height meter thereby acquires a maximum capturing range. In conventional height meters, the measuring beam is focused on the surface to be measured so as to affect the measurement to a minimal extent by surface roughness, scratches or dust particles on the surface, etc. In the novel height meter, inventive use is made of the fact that the surface of the mask to be measured is very well polished and is reasonably free from dust for the height measurement. The radiation spot on the surface to be measured may now be larger, so that the measuring beam may have such a convergence that the radiation beam reflected by the upper side of the mask is focused behind the diaphragm plane, and the radiation beam reflected by the lower side of the mask is focused in front of the mask plane.

The height meter is preferably further characterized in that the diaphragm aperture has a diameter which is approximately equal to the distance between the chief ray of the first reflected radiation beam and the chief ray of the second reflected radiation beam. Even when there are larger height variations, the first reflected radiation beam then continues to reach the detector, whereas the second reflected radiation beam remains blocked.

To achieve that the distance between the first and the second reflected radiation beam is maximal, so that a satisfactory discrimination between these beams is possible, the height meter is further characterized in that the angle between the measuring beam and the normal on the first surface is of the order of 50°.

The height meter is preferably further characterized in that the distance between a radiation spot formed by the measuring beam at the area of the first surface and the diaphragm is as small as possible.

The smallest possible distance is determined by the mechanical peripheral conditions of the device. This measure prevents a reduction of the capturing range due to a tilt of the first surface.

The invention also relates to a novel inspection device for inspecting at least a surface of an object, which device comprises a radiation source for supplying at least an inspection beam, an optical system for each inspection beam for guiding the inspection beam towards the surface to be inspected and for focusing said beam, scanning means for moving the inspection beam relative to the surface to be inspected, so that the entire surface is scanned, and further comprises a height meter for checking the position of the surface to be inspected in a direction perpendicular to the surface. This inspection device is characterized in that the height meter is implemented as described hereinbefore.

More particularly, this inspection device is a mask-inspection device.

The invention further relates to a lithographic apparatus for imaging a mask pattern of a mask on a substrate, which apparatus comprises an illumination system, a mask table for accommodating a mask and a substrate table for accommodating a substrate. This apparatus is characterized in that said mask-inspection device is arranged in the mask supply path to the mask table.

These and other aspects of the invention are apparent from and will be elucidated with reference to the embodiments described hereinafter.

DETAILED DESCRIPTION OF THE INVENTION

Figure 1:
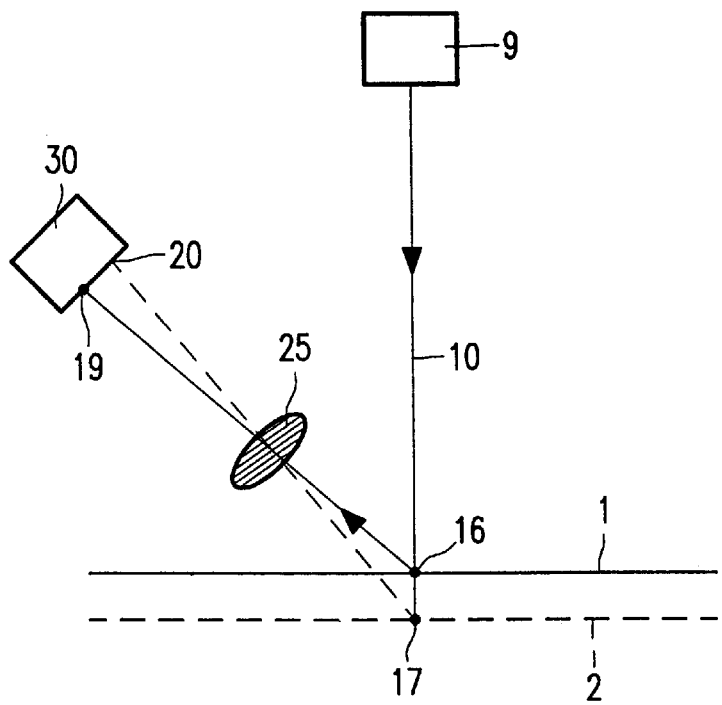
FIG. 1 shows the principle of a known height meter.

The invention will now be described in greater detail with reference to the figures of the drawing.

In FIG. 1, the reference numeral 1 denotes an object surface whose height must be measured. The known height meter, shown diagrammatically, comprises a radiation source 9, for example a diode laser, which transmits a measuring beam, only the chief ray 10 of which is shown. This beam is incident, for example perpendicularly, on a diffuse surface 1 and forms a radiation spot 16 on this surface. The height meter further comprises a lens system, shown diagrammatically by means of a lens element 25, which receives radiation 12 from the surface 1 and images the radiation spot 16 in a radiation spot 19 on a radiation-sensitive detection unit 30. This detection unit is position-sensitive, i.e. its output signal is dependent on the position of the radiation spot 19 with respect to the radiation-sensitive surface of the detection unit. This unit may be constituted, for example by a known position-sensitive semiconductor detector or by a camera such as a CCD camera. If the surface to be measured is displaced, for example towards the position indicated by the broken line 2, the lens system 25 images the radiation spot 17 formed by the measuring beam on the surface in a radiation spot 20 on the detection unit, which radiation spot is displaced with respect to the radiation spot 19. The output signal of the detection unit then has a different value. The value of the output signal is thus a measure of the height of the surface 1.

Figure 2:
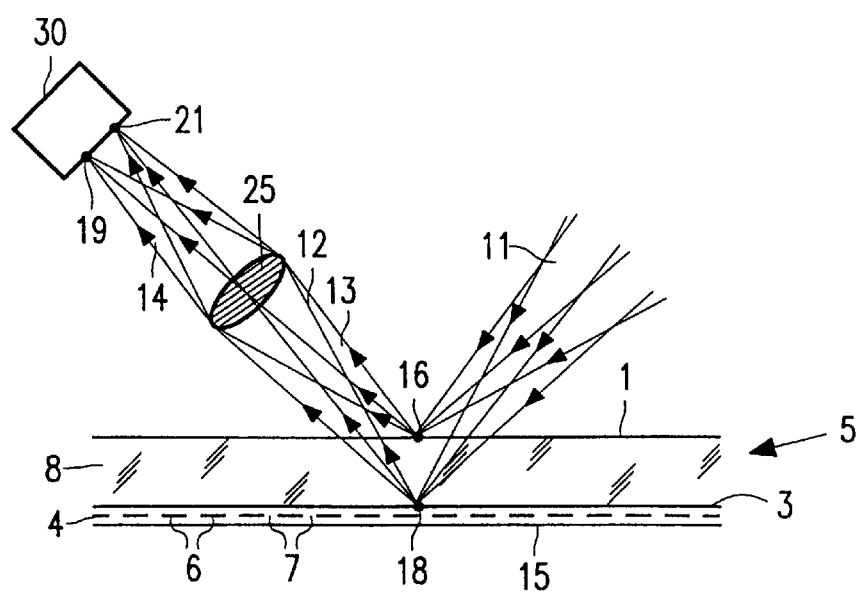
FIG. 2 shows a photolithographic mask and the radiation beams reflected by this mask.

FIG. 2 shows a part of a lithographic mask 5 in a cross-section. This mask comprises a, for example glass, substrate 8 having an upper side 1 and a lower side 3. The pattern 4 which must be imaged on a semiconductor substrate is provided on this lower side. The pattern 4 is constituted by a large number of line-shaped apertures 7 in an opaque layer 6, for example a chromium layer. The mask pattern 4 is covered by a transparent layer 15 in the form of, for example a foil.

If the principle of the height meter shown in FIG. 1, in which the measuring beam is obliquely incident on the surface, is used for measuring the height of the surface 1 of the mask, the problem occurs that radiation of the measuring beam 11 is not only reflected by the upper side 1 of the mask but also by the lower side 3 towards the lens system 25 and the detection unit 30. The lens system then not only forms the actual measuring spot 19 on the detection unit but also images a radiation spot 18 formed by the measuring beam on the lower side of the mask in a radiation spot 21 on the detection unit, This unit cannot make a distinction between the measuring spot 19 and the parasitic radiation spot 21, so that its output signal is also determined by the parasitic spot and is no longer a satisfactory measure of the height of the surface 1. Particularly when an excellently reflecting chromium layer is used as a mask pattern layer, the parasitic spot has a considerably larger intensity than the measuring spot and a satisfactory height measurement is no longer possible.

Figure 3:
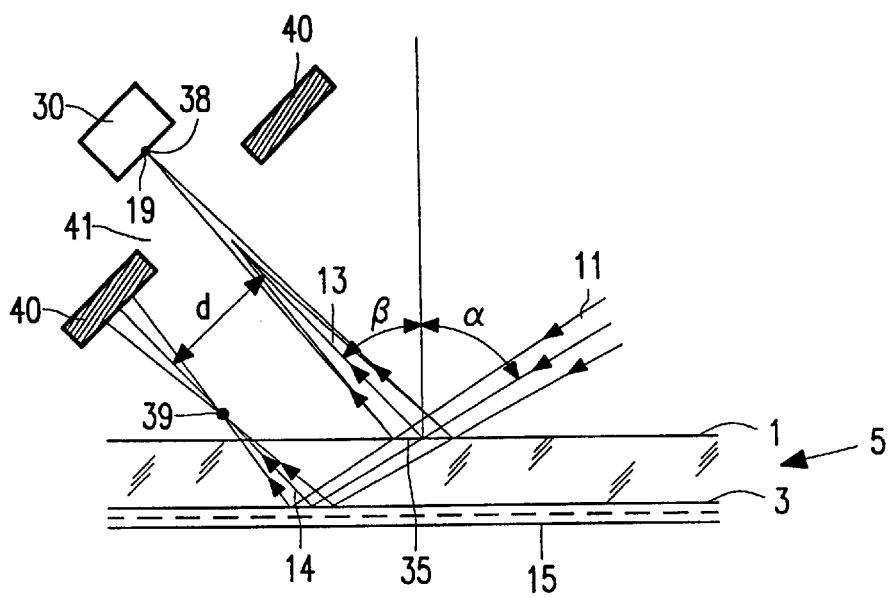
FIG. 3 shows the principle of a height meter according to the invention.

FIG. 3 shows the principle of the height meter according to the invention. The measuring beam 11 is incident at an angle $\alpha$ to the normal on the mask 5 and is specularly reflected, i.e. the reflection angle $\beta$ is equal but opposed to the angle of incidence $\alpha$. A diaphragm 40 is arranged between the upper side 1 of the mask and the detection unit 30, so that the beam 13 reflected by the upper side 1 passes through the diaphragm aperture 41 and can reach the detection unit 30. The beam 14 reflected by the lower side 3 of the substrate is blocked by the diaphragm and cannot reach the detection unit. The output signal from the detection unit is now only determined by the position of the radiation spot 19 formed by the beam 13 on the detection unit, so that this signal is a reliable and accurate measure of the height of the mask 5.

The measuring beam 11 is no longer focused on the upper side 1, as in FIGS. 1 and 2, but this beam now has such a convergence with respect to the position of the diaphragm 40 that, if the mask has the desired height, the focus 38 of the reflected beam 13 is behind the plane of the diaphragm and the focus 39 of the reflected beam 14 is in front of the plane of the diaphragm. Consequently, the height meter has a maximal capturing range. It is true that the radiation spot 35 formed by the measuring beam 11 on the surface 1 is larger than in the case of a conventional height meter, but the risk of the height measurement being affected by dust particles and other contaminations is substantially absent because the surface 1 is well polished and has the degree of freedom from dust required for the height measurement itself.

The plane of the diaphragm is preferably, but not necessarily, perpendicular to the chief ray of the reflected beam 13.

In order to achieve that the distance between the chief rays of the reflected beams 13 and 14 is maximal at the area of the diaphragm plane, so that an unhindered passage of the beam 13 and a satisfactory blocking of the beam 14 are ensured, the angle of incidence $\alpha$ is of the order of 50°. In principle, this angle may have a value of between 0° and 90°; however, it has been found that 50° is an optimum value for this angle.

Moreover, the diameter of the diaphragm aperture 41 is preferably approximately equal to the distance between the chief rays of the beams 13 and 14. It is thereby achieved that, also for larger height variations of the surface 1, the beam 13 continues to pass through the aperture 41, while the beam 14 remains blocked.

If the surface 1 were tilted, the beam 13 would be displaced towards the edge of the diaphragm aperture 41 and the beam 14 would be displaced towards this aperture so that the capturing range would be reduced. To minimize the effect of this tilt, the diaphragm is placed as close to the radiation spot 35 as is mechanically possible.

Figure 4:
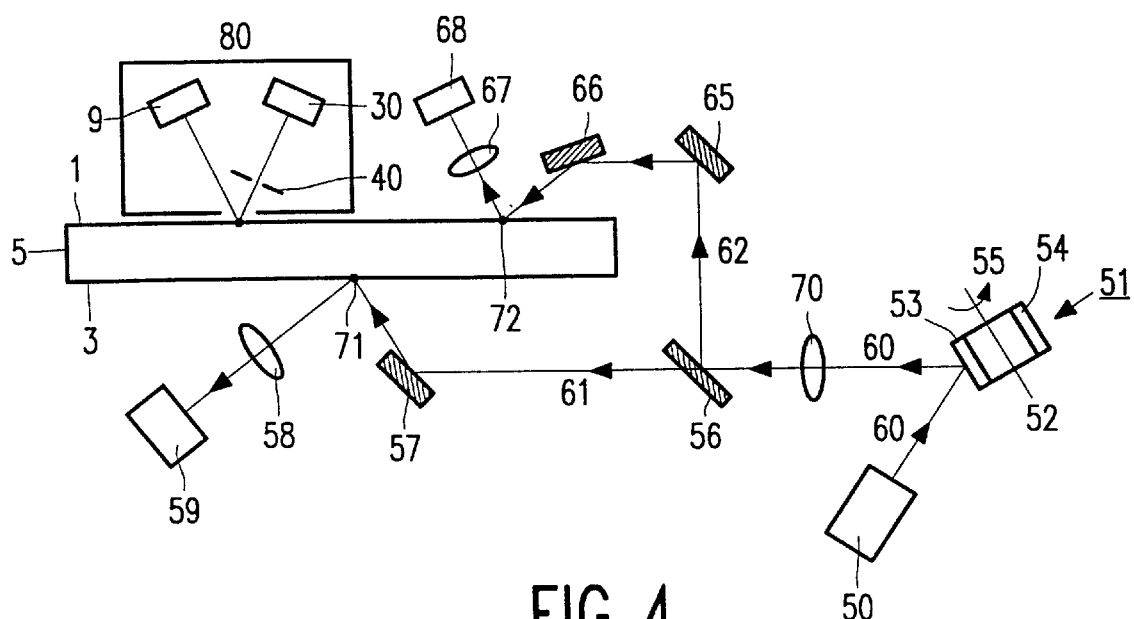
FIG. 4 shows an inspection device provided with such a height meter.

FIG. 4 shows, in a very diagrammatic form, an embodiment of a mask-inspection device provided with a height meter according to the invention. This device comprises a radiation source 50, for example a semiconductor diode laser which transmits a beam 60. This beam must be displaced in a direction across the surface 1, 3 of the mask to be inspected. To this end, a scanning element is arranged in the path of this beam. In this embodiment, this element is constituted by a known mirror polygon 51 having a plurality of mirror facets, two of which, 53 and 54, are shown in FIG. 4. The mirror polygon rotates about an axis 52, as denoted by the arrow 55. Instead of a mirror polygon, another scanning element, for example an oscillating mirror, may be used. The beam reflected by the mirror polygon must be guided towards a surface to be inspected and focused on this surface to form an inspection spot.

As already noted, both the upper side 1 and the lower side 3 of a lithographic mask must be inspected. Two radiation sources and two scanning elements may be used for this purpose. As is shown in FIG. 4, a single radiation source and one scanning element are preferably used, because the volume of the inspection device can then be reduced. A beam splitter, for example in the form of a semi-transparent mirror 56, is arranged in the path of the beam 60 reflected by the mirror polygon 51, which beam splitter splits the beam into a first inspection beam 61 and a second inspection beam 62. For focusing an inspection beam to a radiation spot on the surface to be scanned, a known scan lens, or f-$\theta$ is used. In the embodiment of FIG. 4, this lens, denoted by the reference numeral 70, is arranged between the mirror polygon 51 and the beam splitter 56 so that only one lens of this type is required.

The first inspection beam 61 is reflected by a reflector 57 towards the lower side 3 of the mask 5, where it forms an inspection spot 71. When a dust particle is present at the location of this spot, the radiation of the spot is scattered. A part of the scattered radiation is received by a lens system 58 which concentrates this radiation on a detector 59. If the surface at the location of the inspection spot is clean, the inspection beam is specularly reflected and radiation from this beam cannot reach the detector 59. The output signal from this detector thus indicates whether there is locally a dust particle on the surface 3. The inspection beam 61, and hence the inspection spot 71, is displaced by the rotating mirror polygon on the surface 3 in a first direction perpendicular to the plane of the drawing. To make the inspection spot scan the surface 3 also in a second direction, perpendicularly to the first direction, the mask can be moved into this second direction. The same scanning of the upper surface 1 of the mask is realized by means of a second inspection spot 72 which is formed by the second inspection beam 62 which is reflected, successively by the reflectors 65 and 66, towards the upper surface. Radiation from this spot, scattered by a dust particle, is received by a lens system 67 and concentrated on a detector 68.

The inspection device is provided with a height meter 80 implemented in the manner as described with reference to FIG. 3.

It is to be noted that the inspection device shown in FIG. 4 is only an embodiment and that numerous variants thereof are possible, with all these variants being provided with a height meter according to the invention.

Figure 5:
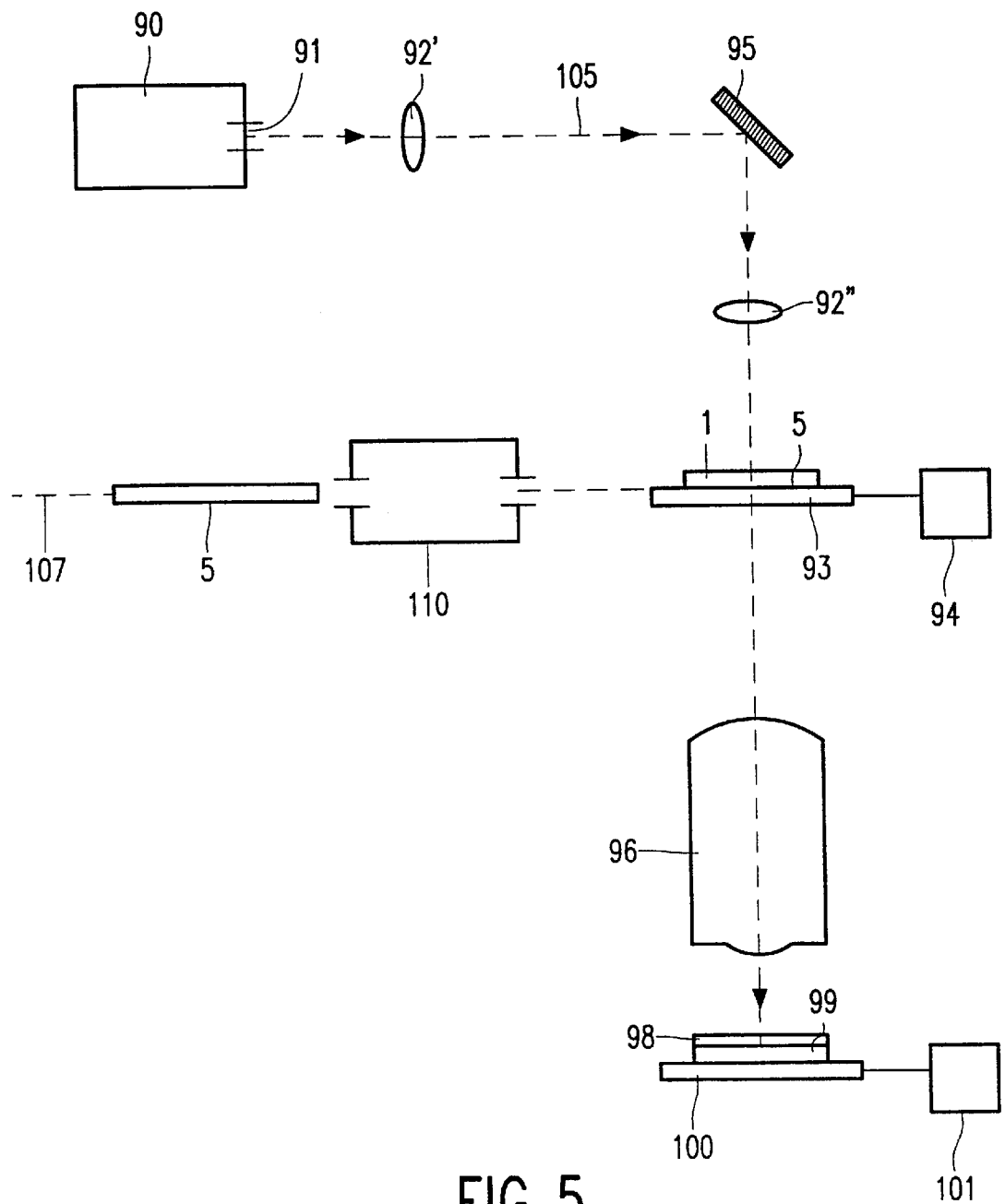
FIG. 5 shows a photolithographic projection apparatus provided with a mask-inspection device.

FIG. 5 shows, in a very diagrammatic form, the principle of an optical lithographic projection apparatus of the scanning type, i.e. a mask 5 and a substrate 99 are synchronously displaced, taking the magnification in a projection beam into account. Only the chief ray 105 of this projection beam is indicated by a broken line. The apparatus may be used for manufacturing micro-elements such as, for example integrated semiconductor circuits, liquid crystalline display panels, or magnetic heads. The apparatus comprises a radiation source 90, for example an excimer laser which supplies a pulsed projection beam 105 via an exit window 91. The exit window may be constituted by the exit plane of an optical integrator, for example a quartz bar, so that a uniform intensity distribution on the exit window is obtained, as described in EP Patent Application 0 658 810. The exit window preferably has an elongate shape in a scanning lithographic apparatus. This window is imaged on the mask 5 by a lens system which comprises, for example two lenses 92', 92" and may be a telescopic system. The mask is arranged on a mask table 93 driven by an actuator 94. The drive is such that the entire mask pattern is scanned with the image of the exit window. The longitudinal direction of the exit window image is perpendicular to the direction of the scanning movement, i.e. the direction in which the mask is moved by the actuator.

A projection lens system 96, diagrammatically indicated in FIG. 5 by a single lens, images the illuminated part of the mask pattern in the radiation-sensitive layer 98 of a substrate 99. This substrate may be a semiconductor wafer. The projection lens system has a magnification of, for example ¼. The substrate 99 is arranged in a substrate table 100 driven by an actuator 101. When imaging the mask pattern, the substrate is moved synchronously with the mask, taking the magnification of the lens system 96 into account, so that a series of juxtaposed images of the consecutively illuminated parts of the mask pattern is formed on the substrate. A possible scanning procedure is described in the article: "Sub-micron 1:1 Optical Lithography" by D. A. Markle in the journal "Semiconductor International" of May 1986, pp. 137–142. After the mask has been fully imaged and thus an IC area of the substrate has been covered, the substrate is displaced with respect to the mask through a distance which is slightly larger than an IC area, and the mask pattern is imaged on a second IC area of the substrate.

To reduce the length of the apparatus, a folding mirror 95 may be arranged in the path of the projection beam.

To ensure that only masks which are very free from dust are introduced into the projection column, comprising the elements 93, 96 and 100, an optical mask-inspection device 110 is arranged in the mask supply path indicated by a broken line 107. This inspection device may be implemented as described with reference to FIG. 4, or may be a different embodiment. However, the inspection device 110 is always provided with a height meter which is implemented as described with reference to FIG. 3.

This height meter and the inspection device provided with this meter may also be used in an optical lithographic projection apparatus of the stepping type. With such an apparatus, the mask pattern is each time imaged in one run on an IC area. Then, the substrate is moved with respect to the mask in such a way that another IC area takes up a position under the mask and the lens system and the mask pattern is imaged on this area. This process is repeated until all IC areas of the substrate have been provided with a mask pattern image. In a stepping projection apparatus, the mask is not moved during the imaging procedure for an IC area of a substrate, and the actuator 94 is absent. The invention may be alternatively used in an optical lithographic apparatus operating in accordance with the proximity printing principle. This method does not employ a projection lens system, but the mask is arranged at a distance of the order of one micron from the substrate and a shadow image of the mask is formed on the substrate.

The height meter and the inspection device according to the invention may also be used in a lithographic apparatus in which a charged-particle beam, such as an ion beam, an electron beam or an X-ray beam is used as a projection beam. In these types of apparatus, with which images can be formed which have even smaller details than those formed with optical lithographic apparatuses, even more stringent requirements are imposed on the dust freedom of the mask and an accurate and reliable inspection device is of even greater importance.

The invention has been described with reference to a lithographic mask and a lithographic apparatus, but is not limited thereto. The invention may also be used in other imaging systems with which images having very small details must be formed, and also generally wherever two facing surfaces of a transparent object must be inspected.

What is claimed is:

1. An optical height meter for measuring the height of a first surface of a transparent object having a second reflective surface facing the first surface, said height meter comprising a radiation source for supplying a converging measuring beam whose chief ray extends at a first angle to the normal on the first surface, and a position-sensitive detection unit for detecting a radiation beam reflected by the first surface and forming a focus spot on the surface of the detector unit, said position-sensitive detection unit producing an output signal dependent upon the position of the focus spot on its surface, the chief ray of said radiation beam extending at a second angle to said normal, which angle is opposite to the first angle, and a single-apertured diaphragm being arranged between the first surface and the detection unit in the radiation path of the reflected radiation beam, characterized in that the diaphragm is arranged at such a position and has such an aperture that only said, first, reflected radiation beam can pass through said aperture and reach the detection unit, forming a single focus spot thereupon, and that a second radiation beam reflected by the second surface is blocked by the diaphragm.

2. An optical height meter as claimed in claim 1, wherein the measuring beam is focused in a plane behind the object, and in that the diaphragm is situated in a plane between the focal plane of the first reflected beam and the focal plane of the second reflected beam.

3. An optical height meter as claimed in claim 1, wherein the diaphragm aperture has a diameter which is approximately equal to the distance between the chief ray of the first reflected radiation beam and the chief ray of the second reflected radiation beam.

4. An optical height meter as claimed in claim 1, wherein the angle between the measuring beam and the normal on the first surface is of the order of 50°.

5. An optical height meter as claimed in claim 1, wherein the distance between a radiation spot formed by the measuring beam at the area of the first surface and the diaphragm is as small as possible.

6. An optical inspection device for inspecting at least a first surface of a transparent object having a second, reflecting surface facing said at least first surface, which device comprises a radiation source for supplying at least one inspection beam, an optical device for said at least one inspection beam for guiding said at least one inspection beam towards said at least first surface and for focusing said at least one inspection beam, scanning means for moving said at least one inspection beam relative to said at least first surface, so that the entire said at least first surface is inspected, and further comprises a height meter for checking the position of said at least first surface in a direction perpendicular to said second surface, wherein the height meter comprises a radiation source unit for supplying a converging measuring beam whose chief ray extends at a first normal on said at least first surface, a position-sensitive detection unit for detecting a first radiation beam reflected by said at least first surface and forming a single focus spot on the surface of the position-sensitive detection unit, said position-sensitive detection unit producing an output signal dependent upon the position of the focus spot on its surface, the chief ray of said first, reflected, radiation beam extending at a second angle to said normal, which second angle is opposite to the first angle, and a, single-apertured diaphragm arranged between said at least first surface and the detection unit in the radiation path of said first, reflected, radiation beam, and wherein the diaphragm is arranged at such a position and has such an aperture that only said first reflected beam can pass through said aperture and reach the detection unit, forming a single focus spot thereupon, and a second radiation beam reflected by the second, reflecting, surface is blocked by the diaphragm.

7. A lithographic apparatus for imaging a mask pattern of a mask on a substrate, which apparatus comprises an illumination system, a mask table for accommodating a mask and a substrate table for accommodating a substrate, wherein a optical inspection device as claimed in claim 6 is arranged in a mask supply path to the mask table.

8. A mask-inspection device for detecting dust particles on, and defects in, a lithographic mask, comprising an optical inspection device of claim 6.

* * * * *